SERIES-PARALLEL TRANSISTOR CIRCUITS

Filed March 16, 1955 2 Sheets-Sheet 1

INVENTOR
NATHAN FREEDMAN
BY [signature]
ATTORNEY

SERIES-PARALLEL TRANSISTOR CIRCUITS

Filed March 16, 1955 2 Sheets-Sheet 2

INVENTOR
NATHAN FREEDMAN
BY [signature]
ATTORNEY

United States Patent Office 2,882,353

Patented Apr. 14, 1959

2,882,353

SERIES-PARALLEL TRANSISTOR CIRCUITS

Nathan Freedman, Auburndale, Mass., assignor to Raytheon Manufacturing Company, Waltham, Mass., a corporation of Delaware Application March 16, 1955, Serial No. 494,737

4 Claims. (Cl. 179—171)

This invention relates generally to amplifying circuits utilizing semiconductive devices, and more particularly to novel circuits for operating such amplifiers wherein greater gain may be obtained between relatively high source and load impedances.

There has recently been developed a new type of electrical translation device comprising a body of semiconducting material having in contact therewith a plurality of current-conducting electrodes. The lattice structure of the semiconducting body, which may be germanium, for example, may be disrupted by the inclusion therein of impurity elements which alter the electrical conductivity characteristics of the semiconducting material, and give rise to N-type conduction or P-type conduction. As is now well known, N-type conduction refers to current transfer in the semiconductor which takes place principally by electrons, while P-type conduction refers to current transfer principally by holes; the term "holes" being further defined as a mobile vacancy in the electronic valence structure of a semiconductor, which acts like a positive electronic charge with a positive mass. The device has been termed a transistor, and the electrodes in contact with the semiconducting body have been designated as emitter, collector, and base electrodes. An alternating current signal may be applied between two of the electrodes, and, due to transistor action associated with the flow of current in the semiconductor body, an amplified replica of the applied signal may be obtained across the remaining electrode and the one of the first two which has been chosen to be included in both the input and output circuit.

A feature of the use of transistors as amplifying mediums, which proves disadvantageous in certain applications, is the wide difference in values of the input and output impedances of the devices. Since the transistor is a biased device with a source of direct potential connected between the emitter and base electrodes for biasing them in a relatively conducting direction, this condition gives rise to low values of device input impedance. In contradistinction, the output impedance is high because the output signal is obtained between the collector and base electrodes which, are biased in a relatively nonconducting direction, thereby resulting in high values of output impedance. Typical values for input impedance are found to be on the order of 1,000 ohms for the grounded emitter connection, while the output impedance may be on the order of 500,000 ohms or even higher.

Accordingly, the present invention is directed to novel transistor circuit connections wherein the input impedance of an amplifier stage is caused to rise somewhat, while the output impedance decreases markedly, thus allowing the direct cascading of stages to be accomplished with less mismatch loss, and eliminating the need for impedance matching means between successive stages, such as transformers, which was heretofore necessary. This desirable result is attained essentially by arranging the input to a plurality of transistors in series relation so that the input current to a stage remains constant event with the addition of more transistors, while the outputs of the transistors are connected in parallel, thus allowing greater gain due to the additional flow of current through the load, and at the same time reducing the output impedance of the stage.

The invention will be better understood as the following description proceeds taken in conjunction with the accompanying drawings wherein.

Figures 1, 2:
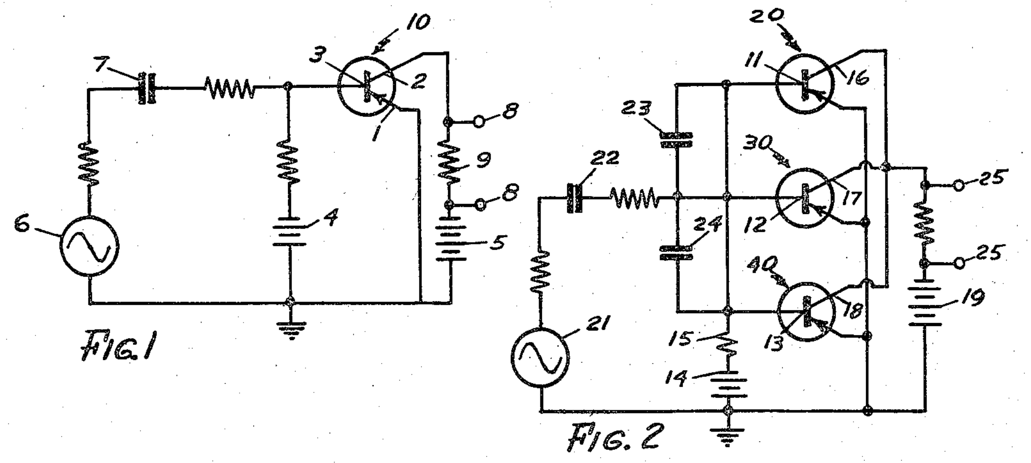
Fig. 1 is a schematic diagram of a conventional transistor amplifier circuit.
Fig. 2 is a schematic diagram of a parallel connected amplifier stage utilizing transistors useful in explaining the present invention.

Referring now to the drawings, and more particularly to Figs. 1 to 5 thereof, there is shown in Fig. 1 a previously known semiconductor device arranged as an amplifier, which has been included to explain the theory of operation of a semiconductor amplifier. The amplifier comprises a transistor, designated generally at 10, having an emitter electrode 1, a collector electrode 2, and a base electrode 3. Transistor 10 is preferably of the junction type, but a point contact type may be used if desired. A suitable voltage source, such as battery 4, is connected between base electrode 3 and emitter electrode 1, and is of such polarity as to bias them in a relatively conducting direction. Accordingly, when the transistor is of the so-called PNP type, the emitter electrode 1 should have a positive potential with respect to base electrode 3, as illustrated. Another source of voltage, such as a battery 5, is provided having its negative terminal connected to collector 2 and its positive terminal grounded in order to bias the collector in a relatively nonconducting direction with respect to the base electrode 3. A source of input signal, indicated at 6, is applied to base electrode 3 through a coupling condenser 7. Due to transistor action, an amplified output signal may then be obtained at terminals 8, 8, across load resistor 9. As shown by curve A in Fig. 5, tests have indicated that a maximum relative voltage gain of 9 may be expected at the lower frequencies in a conventional junction transistor amplifier, with the gain falling off considerably at higher frequencies. Further, as has already been pointed out, the circuit of Fig. 1 is also subject to the disadvantage that input impedance of the transistor 10 as measured between base electrode 3 and emitter electrode 1 is considerably lower than the output impedance measured between collector 2 and emitter 1.

Figure 5:
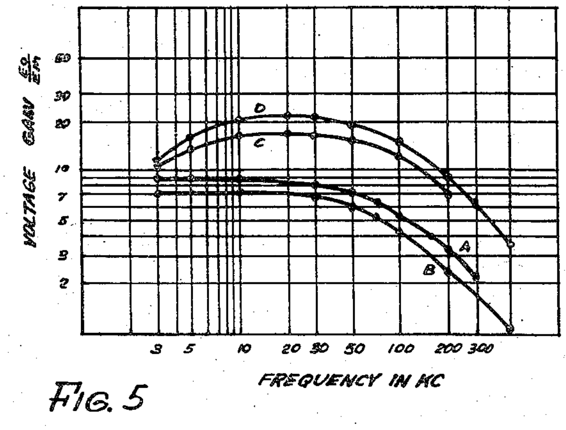
Fig. 5 is a graph of voltage gain versus frequency for the circuits of Figs. 1 to 4.

It is instructive to consider the problem of paralleling a plurality of transistors in an attempt to obtain gain between relatively high source and load impedances. Fig. 2 illustrates an amplifier circuit comprising a plurality of transistors 20, 30, and 40, having their respective base electrodes 11, 12, and 13 connected in parallel relation and supplied with direct current bias voltage from battery 14 through resistor 15. Collector electrodes 16, 17 and 18 are also in parallel, and supplied with an appropriate direct current potential from battery 19. In paralleling a plurality of vacuum tubes, it is apparent that the voltage gain will be increased since the tube plate currents will add, the paralleling of the input impedances having little or no effect, since they are generally extremely high. However, when attempts are made to so connect transistors, the low input impedances associated with transistors result in defeat, since paralleling a plurality of transistors across a high impedance source causes a great reduction in the actual input voltage to the transistors. Accordingly, an input signal applied from a source 21 through coupling condensers 22, 23, and 24 to transistors 20, 30, and 40 results in an output voltage derived at terminals 25, 25 which, as shown by curve B of Fig. 5, is little different from that obtained with a single transistor. Paralleling actually seems to drop the gain, although this loss is of small magnitude.

Figures 3, 4:
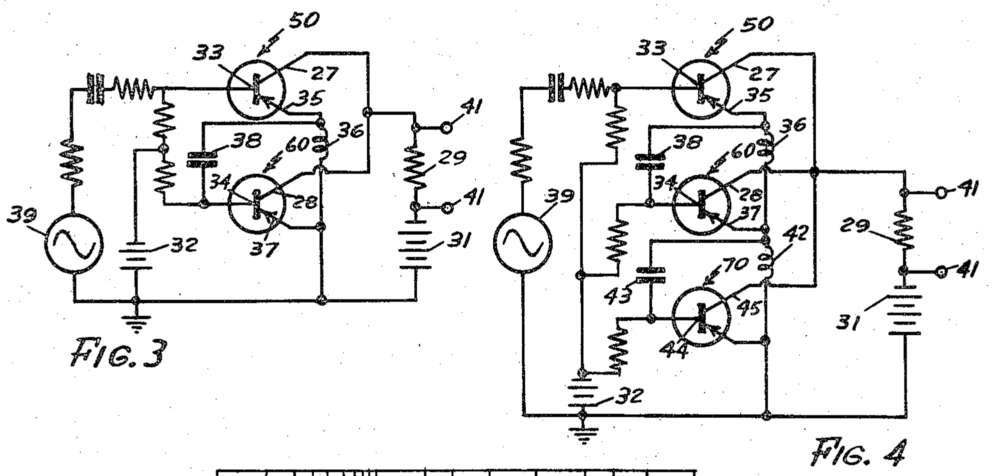
Fig. 3 is a schematic diagram of an amplifier circuit in accordance with the present invention.
Fig. 4 is a schematic diagram of another embodiment of the present invention.

In accordance with the present invention, the novel amplifier circuit illustrated in Fig. 3 has been evolved to overcome the deficiencies of the parallel arrangement. In Fig. 3 there are shown two transistors 50 and 60 having their collectors 27 and 28 connected in parallel with load resistor 29, and supplied with an appropriate bias voltage from battery 31. Another source of direct current voltage, such as battery 32, supplies bias voltage to the base 33 of transistor 50 and to the base of transistor 60. Emitter 35 of transistor 50 is connected to ground through choke coil 36, and emitter 37 of transistor 60 is grounded directly. To provide a path for the alternating current input signal, emitter 35 of transistor 50 is also connected to base 34 of transistor 60 through condenser 38. With the arrangement described, the application of an input signal from source 39 will result in an output signal appearing at terminals 41, 41, which displays considerably more gain than that attained with heretofore known circuits, as shown by curve C of Fig. 5. In addition to the desirable higher gain, it can be shown by mathematical calculation substantiated by the results of conducted tests that the input impedance to the amplifier stage of Fig. 3 is substantially doubled when compared to that of Fig. 1, while the output impedance is decreased by a sizeable factor, thus resulting in an amplifier stage wherein input and output impedances are both on the order of 1,000 ohms.

The invention is not limited to the circuit shown in Fig. 3. As illustrated by curve D of Fig. 5, still higher gain may be obtained by utilizing the amplifier stage of Fig. 4. This circuit is identical with that of Fig. 3 except that an additional transistor 70, along with an appropriate choke coil 42, has been added. Condenser 43 allows the input signal from source 39 to be applied serially to base 44, while collector 45 is connected in parallel with the collectors of transistors 50 and 60.

Figures 6, 7:
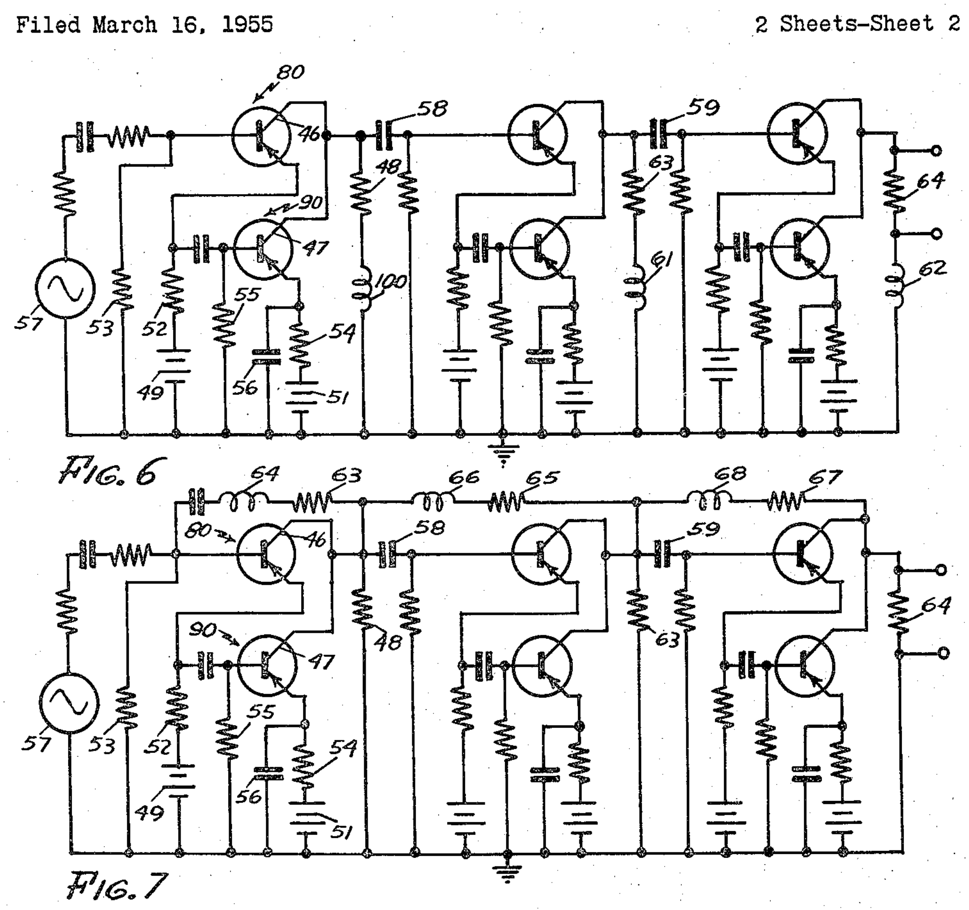
Fig. 6 is a schematic diagram of a multistage amplifier circuit in accordance with the invention and employing bandwidth compensation.
Fig. 7 is a schematic diagram of a multistage amplifier circuit similar to Fig. 6 but employing a different kind of bandwidth compensation.
Figures 8, 9:
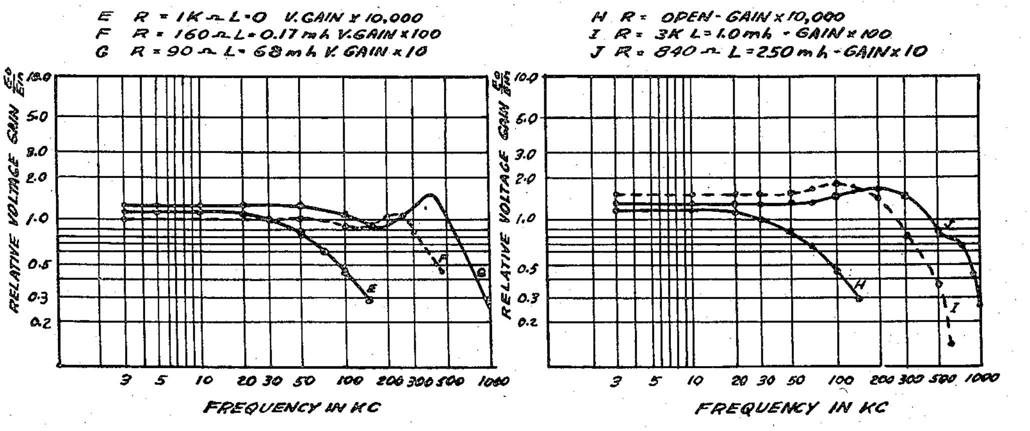
Fig. 8 is a graph of voltage gain versus frequency of the circuit of Fig. 6.
Fig. 9 is a graph of voltage gain versus frequency of the circuit of Fig. 7.

Figs. 6 and 7 show further embodiments of the present invention as applied to multistage amplifiers. In Fig. 6, the first stage of the amplifier consists of two transistors 80 and 90 having their respective collectors 46 and 47 connected in parallel to load resistor 48. Batteries 49 and 51 acting in conjunction with resistors 52, 53, 54, and 55 supply the necessary biasing voltages for the electrodes of the transistors. By-pass condenser 56 is provided to create a path for an alternating current signal around resistor 54 and battery 51. In order to increase the bandwidth of frequencies over which reasonable gain can be attained, an inductance 100 is connected between resistor 48 and ground. An input signal from source 57 will result in an amplified stage output signal appearing across resistor 48, which may then be directly coupled to the succeeding stage through condenser 58, and after further amplification, coupled through condenser 59 to the last amplifier stage. Inductances 61 and 62 are also provided in the succeeding stages to perform the same function as inductance 100. The curves of Fig. 8 show the effect on bandwidth response and gain of utilizing various numerical values for resistances 48, 63 and 64, and inductances 100, 61 and 62.

If desired, bandwidth compensation may be accomplished by the feedback method shown in Fig. 7. This circuit is identical with that of Fig. 6, except that inductances 100, 61, and 62 have been eliminated, and each stage is provided with feedback from collector to base through resistor 63 and inductor 64, resistor 65 and inductor 66, and resistor 67 and inductor 68, respectively. As seen from Fig. 9, this method of compensation produces a slightly flatter frequency response curve over approximately the same frequency bandwidth as that covered by the circuit of Fig. 6.

It can thus be seen that a novel amplifier circuit has been provided wherein input and output impedances are made substantially the same, and allows the direct cascading of transistorized stages without the intervention of additional impedance matching means. Although there have been shown what are considered to be preferred embodiments of the present invention, various adaptations and modifications thereof may be made without departing from the spirit and scope of the invention as defined in the appended claims.

What is claimed is:

1. An amplifier circuit comprising a plurality of semiconductive devices each having at least an emitter electrode, a base electrode, and a collector electrode, a first corresponding one of said electrodes of each of said devices being included only in the input portion of said amplifier circuit, a second corresponding one of each of said electrodes being included only in the output portion of said amplifier circuit, while a third corresponding one of each of said electrodes is included in both said input and output portions, means for applying biasing voltages to said electrodes, means connecting said second corresponding electrodes directly to each other, an input circuit connected to said devices including means for applying an input signal to said devices, means connected between said third electrode of one of said devices and said first electrode of the next succeeding of said devices for passing said input signal serially through said devices, means connected between said third electrode of one of said devices and direct current ground for preventing the passage of said input signal therethrough, and an output circuit connected to said directly-connected second electrodes.

2. An amplifier circuit comprising a plurality of semiconductive devices each having at least an emitter electrode, a base electrode, and a collector electrode, the base electrodes of each of said devices being included only in the input portion of said amplifier circuit, the collector electrodes of each of said devices being included only in the output portion of said amplifier circuit, while the emitter electrodes of each of said devices is included in both said input and output portions, means for applying biasing voltages to said electrodes, means directly connecting said collector electrodes to each other, an input circuit connected to said devices including means for applying and input signal to said devices, means connected between said emitter electrode of one of said devices and said base electrode of the next succeeding of said devices for passing said input signal serially through said devices, means connected between said emitter electrode of one of said devices and direct current ground for preventing the passage of said input signal therethrough, and an output circuit connected to said directly-connected collector electrodes.

3. An amplifier circuit comprising a plurality of semiconductive devices each having at least an emitter electrode, a base electrode, and a collector electrode, the base electrodes of each of said devices being included only in the input portion of said amplifier circuit, the collector electrodes of each of said devices being included only in the output portion of said amplifier circuit, while the emitter electrodes of each of said devices is included in both said input and output portions, means for applying biasing voltages to said electrodes, means directly connecting said collector electrodes to each other, an input circuit connected to said devices including means for applying an input signal to said devices, means connected between said emitter electrode of one of said devices and said base electrode of the next succeeding of said devices for passing said input signal serially through said devices, means connected between said emitter electrode of one of said devices and direct current ground for preventing the passage of said input signal therethrough, an output circuit connected to said directly-connected collector electrodes, and means including an inductance in said output circuit for broadening the band width response of said amplifier.

4. An amplifier circuit comprising a plurality of semiconductive devices each having at least an emitter electrode, a base electrode, and a collector electrode, the base electrodes of each of said devices being included only in the input portion of said amplifier circuit, the collector electrodes of each of said devices being included only in the output portion of said amplifier circuit, while the emitter electrodes of each of said devices is included in both said input and output portions, means for applying biasing voltages to said electrodes, means directly connecting said collector electrodes to each other, an input circuit connected to said devices including means for applying an input signal to said devices, means connected between said emitter electrode of one of said devices and said base electrode of the next succeeding of said devices for passing said input signal serially through said devices, means connected between said emitter electrode of one of said devices and direct current ground for preventing the passage of said input signal therethrough, an output circuit connected to said directly-connected collector electrodes, and feedback means connected between said collector electrodes and said base electrodes.

References Cited in the file of this patent

UNITED STATES PATENTS

| | | |
|---|---|---|
| 2,663,806 | Darlington | Dec. 22, 1953 |
| 2,663,830 | Oliver | Dec. 22, 1953 |
| 2,762,870 | Sziklai | Sept. 11, 1956 |

OTHER REFERENCES

Shea: "Principles of Transistor Circuits," pages 252–255, 264, 265, published 1953 by John Wiley and Sons, New York city. (Copy in Class. Div. II.)

Riddle article: "Electronics," April 1954, pages 169–171.